United States Patent
Huang et al.

(10) Patent No.: US 6,291,329 B1
(45) Date of Patent: Sep. 18, 2001

(54) PROTECTIVE OXIDE BUFFER LAYER FOR ARC REMOVAL

(75) Inventors: Richard J. Huang; Lewis Shen, both of Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/371,921

(22) Filed: Aug. 11, 1999

(51) Int. Cl.[7] ................................. H01L 21/3205
(52) U.S. Cl. ..................... 438/585; 438/303; 438/305
(58) Field of Search .................................. 438/585

(56) References Cited

U.S. PATENT DOCUMENTS

| | | | |
|---|---|---|---|
| 4,992,306 | * | 2/1991 | Hochberg et al. ............... 427/255.3 |
| 5,677,231 | * | 10/1997 | Maniar et al. ..................... 437/67 |
| 5,891,784 | * | 4/1999 | Cheung et al. ..................... 438/303 |
| 6,049,093 | * | 4/2000 | Manning et al. ................... 257/67 |
| 6,083,852 | * | 7/2000 | Cheung et al. ..................... 438/791 |
| 6,090,722 | * | 7/2000 | Armacost et al. .................. 438/763 |
| 6,097,090 | * | 8/2000 | Tran et al. ........................ 257/750 |

* cited by examiner

Primary Examiner—John F. Niebling
Assistant Examiner—Olivia Luk

(57) ABSTRACT

An oxide buffer layer is formed between an underlying silicon layer and overlying ARC to prevent damage to the silicon layer when removing the ARC. Embodiments include depositing a silicon oxide buffer layer on an amorphous or polycrystalline silicon layer by PCVD, LPCVD or high temperature CVD, forming a SiON or Si-rich SiN ARC on the silicon oxide buffer layer, forming a photoresist mask on the ARC, patterning the underlying silicon layer to form a conductive line or gate electrode, stripping the photoresist mask and then stripping the ARC with hot phosphoric acid while the silicon oxide buffer layer protects the underlying silicon feature from pitting.

8 Claims, 2 Drawing Sheets

PROTECTIVE OXIDE BUFFER LAYER FOR ARC REMOVAL

RELATED APPLICATIONS

This application contains subject matter similar to subject matter disclosed in copending U.S. patent application Ser. No. 09/371,922 filed on Aug. 11, 1999, the entire disclosure of which is incorporated by reference herein.

TECHNICAL FIELD

The present invention relates to a method of manufacturing a semiconductor device having sub-micron features. The present invention has particular applicability in manufacturing semiconductor devices with a design rule of about 0.18 micron and under with accurately dimensioned conductive features.

BACKGROUND ART

The escalating requirements for high density and performance associated with ultra large scale integration require responsive changes in electrical interconnect patterns, which is considered one of the most demanding aspects of ultra-large scale integration technology. Demands for ultra-large scale integration semiconductor wiring require increasingly denser arrays with minimal spacing between conductive lines. Implementation becomes problematic in manufacturing semiconductor devices having a design rule of about 0.18 micron and under, e.g., about 0.15 micron and under.

Semiconductor devices typically comprise a substrate and elements, such as transistors and/or memory cells, thereon. Various interconnection layers are formed on the semiconductor substrate to electrically connect these elements to each other and to external circuits. The formation of gate electrodes and interconnection lines is partly accomplished utilizing conventional photolithographic techniques to form a photoresist mask comprising a pattern and transferring the pattern to an underlying layer or composite by etching the exposed underlying regions.

In accordance with conventional practices, an anti-reflective coating (ARC) is typically provided between the photoresist layer and an underlying silicon layer to avoid deleterious reflections from the underlying silicon layer during patterning of the photoresist layer. ARCs are chosen for their optical properties and compatibility with the underlying silicon layer and typically include a silicon oxynitride, silicon-rich silicon nitride or titanium nitride. Conventional deep-ultraviolet (deep-UV) photoresist processing typically involves exposure to deep-UV radiation having a wavelength of about 100 nm to about 300 nm.

As miniaturization proceeds apace with an attendant shrinkage in size of individual semiconductor devices and crowding more devices into any given unit area, problems arise with respect to maintaining the accuracy of the dimensions of various features, notably polycrystalline silicon gate electrodes. During conventional processing, the ARC is deposited on an amorphous silicon (subsequently crystallized during processing) or polycrystalline silicon layer and a photomask formed on the ARC. In forming a conductive feature, e.g., gate electrode, the integrity of the ARC is deteriorated by virtue of various processing steps. For example, during ion implantation, the uniformity of its etchability is alternated. Moreover the integrity of the ARC is deteriorated during stripping of resist with a solvent. As a result, during conventional stripping of the ARC, as with hot phosphoric acid or by dry etching employing $CF_4$ and $O_2$ chemistry, the underlying silicon layer is damaged, as by pitting.

Conventional methodology for forming a gate electrode is schematically illustrated in FIGS. 1A and 1B, wherein similar features are denoted by similar reference numerals. Adverting to FIG. 1A, amorphous or polycrystalline silicon gate electrode layer 12 is formed on gate dielectric layer 11 overlying substrate 10, and ARC 13 is formed on gate electrode 12. As a result of previous processing, including ion implantation and stripping of the photoresist mask, the integrity of ARC 13 has been damaged in that it does not exhibit a uniform removal rate and exhibits porosity. Consequently, as shown in FIG. 1B, upon stripping ARC 13 in a conventional manner, as by employing hot phosphoric acid or dry etching, the upper surface 14 of a gate electrode 12 is pitted thereby adversely impacting device performance.

There exists a need for methodology enabling patterning of a conductive feature, such as a silicon gate electrode, with improved accuracy and integrity. There exists a further need for such methodology enabling the formation of gate electrodes without surface pitting.

SUMMARY OF THE INVENTION

An advantage of the present invention is a method of manufacturing a semiconductive device having accurately dimensioned conductive features, such as gate electrodes.

Another advantage of the present invention is a method of manufacturing a semicondutive device having gate electrodes with high integrity and without surface pitting.

Additional advantages and features of the present invention will be set forth in part in the description which follows and in part will become apparent to those having ordinary skill in the art upon examination of the following or may be learned from the practice of the invention. The advantages of the present invention may be realized and obtained as particularly pointed out in the appended claims.

According to the present invention, the foregoing and other advantages are achieved in part by a method of manufacturing a semiconductor device, the method comprising: forming a silicon layer; forming a protective oxide layer on the silicon layers; forming an ARC on the protective oxide layer; patterning the silicon layer to form a conductive feature; and removing the ARC.

Embodiments of the present invention include depositing a protective silicon oxide layer, at a thickness of about 50 Å to about 100 Å, on an upper surface of an amorphous or polycrystalline silicon layer by chemical vapor deposition (CVD), e.g., plasma enhanced chemical vapor deposition (PECVD), low pressure chemical vapor deposition (LPCVD) or in a furnace containing silane ($SiH_4$) and nitrous oxide ($N_2O$). A silicon oxide or silicon-rich ARC is formed on the protective oxide layer and photolithographic processing is conducted in a conventional manner to pattern the underlying silicon layer, as in forming a gate electrode. Subsequently, ion implantation is conducted to form source/drain regions and the photoresist mask stripped. The ARC is then removed in a conventional manner, as by stripping with hot phosphoric acid or dry etching without damage to the underlying silicon layer by virtue of the protective oxide layer formed thereon.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawing and description are to be regarded as illustrative in nature, and not as restrictive.

DESCRIPTION OF THE INVENTION

Figure 1A:
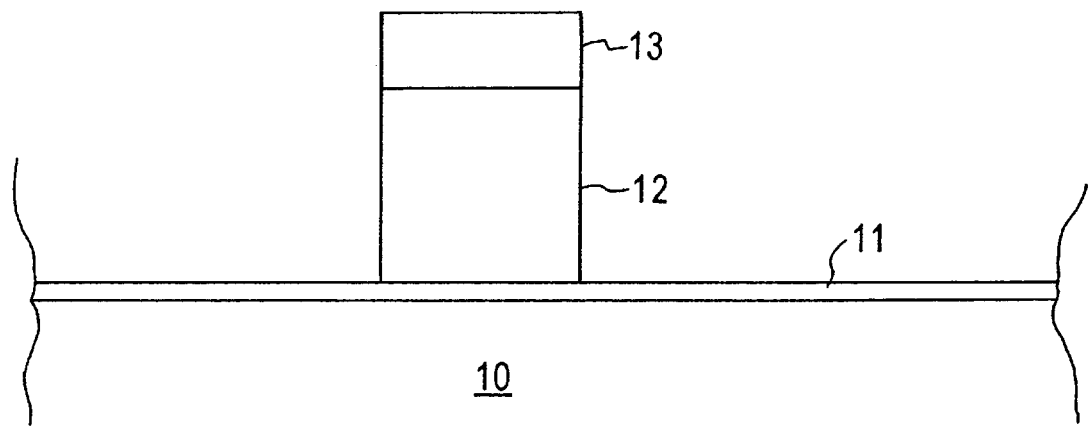
FIGS. 1A and 1B schematically illustrate conventional gate electrode methodology.
Figure 1B:
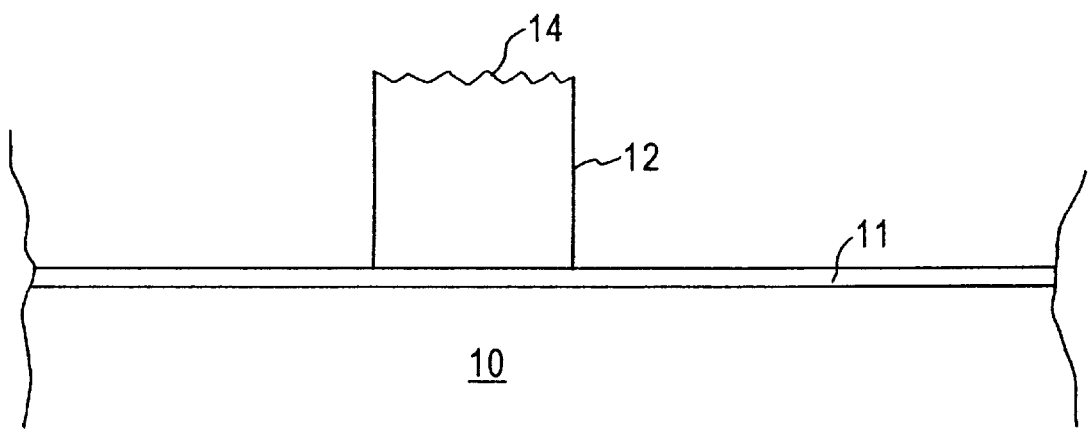

The present invention addresses and solves problems attending upon conventional methodology in forming conductive features, particularly gate electrodes. Such problems include surface attack by hot phosphoric acid or during dry etching when removing an overlying ARC from a patterned silicon feature. It is believed that such problems stem from deterioration of the ARC during previous processing, e.g., ion implantation and photoresist stripping. The deterioration of the ARC renders the underlying silicon surface susceptible to attack during ARC removal.

The present invention addresses and solves such problems by strategically forming a protective buffer oxide layer on the silicon layer prior to forming the ARC thereon. Thus, a protective oxide buffer layer is interposed between the ARC and the underlying silicon layer prior to patterning. Accordingly, during the removal of the ARC, the underlying silicon layer is protected by the oxide buffer layer.

The oxide buffer layer formed in accordance with the present invention is substantially transparent to UV light and, hence, does not substantially alter the reflectiveness of the surface such that the combined ARC and oxide buffer layer essentially function as an anti-reflective layer to UV light. The oxide buffer layer additionally protects the underlying silicon layer from pitting by hot phosphoric acid or from dry etching when stripping the ARC.

The silicon oxide buffer layer according to embodiments of the present invention is deposited at a suitable thickness to perform the disclosed function, e.g., about 50 Å to about 100 Å. The ARC can be deposited at a conventional thickness, e.g., at about 2 Å to about 300 Å, and can comprise a conventional silicon oxide nitride or a silicon-rich silicon nitride ARC material.

The protective oxide buffer layer according to the embodiments of the present invention can be deposited in various ways, such as by CVD. In an embodiment of the present invention, the silicon oxide buffer layer is deposited by PECVD, as at a temperature of about 400° C. to about 500° C. and a pressure of about 0.5 to about 5 Torr in an atmosphere comprising $SiH_4$ and $N_2O$. Advantageously, the protective silicon oxide buffer layer can be deposited in the same tool in which the silicon layer is deposited. The silicon layer can be deposited as an amorphous layer or as a polycrystalline silicon layer. A deposited amorphous layer is subsequently crystallized during processing.

In another embodiment of the present invention, the protective silicon oxide buffer layer is deposited by LPCVD as at a thickness of about 50 Å to about 100 Å employing tetraethyl orthosilicate (TEOS) and $N_2O$ at an elevated temperature of about 700° C. to about 800° C. and a pressure of about 5 to about 10 Torr. The resulting silicon oxide buffer layer produced by LPCVD exhibits greater density and less contamination than that deposited by PECVD and, hence, provides greater protection to the silicon surface than the silicon oxide buffer layer formed by PECVD.

In accordance with another embodiment of the present invention, a highly dense and relative clean silicon oxide buffer layer with reduced contamination is deposited as a high temperature oxide by CVD employing $SiH_4$ and $N_2O$ in a furnace at a temperature of about 800° C. to about 850° C.

Figure 2A:
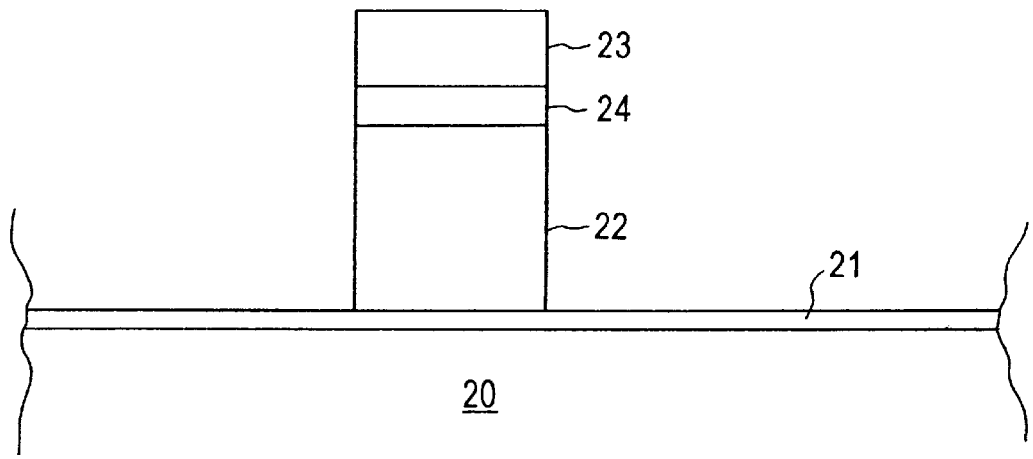
FIGS. 2A–2B schematically illustrate an embodiment of the present invention.
Figure 2B:
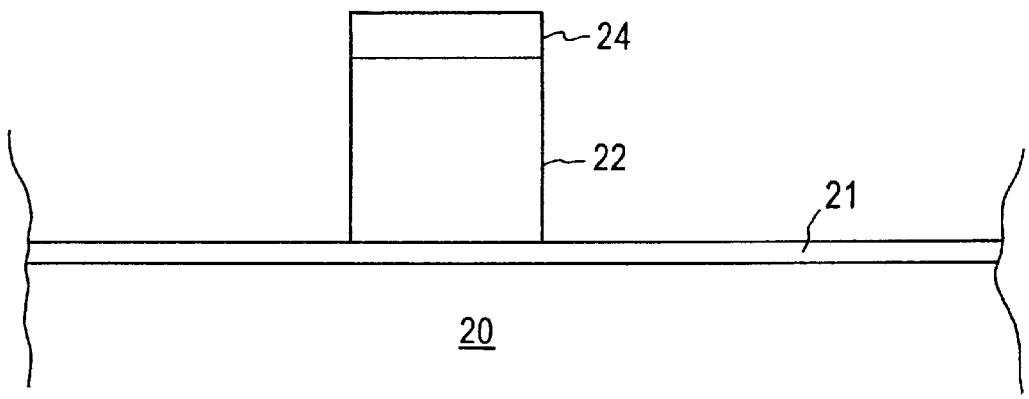

An embodiment of the present invention is schematically illustrated in FIGS. 2A–2B, wherein similar features bear similar reference numerals. Adverting to FIG. 2A, a patterned gate electrode structure is formed comprising gate electrode 22 on gate dielectrode layer 21 overlying substrate 20. ARC 23, e.g., a silicon oxynitride or silicon-rich silicon nitride layer, is formed overlying gate electrode 22 with protective oxide layer 24 therebetween. Protective oxide layer 24 protects the upper surface of gate electrode 22 during removal of ARC 23, as by stripping with hot phosphoric acid or by dry etching.

The present invention enjoys industrial utility in manufacturing any of various types of semiconductor devices, particularly semiconductor devices having features in the deep sub-micron range, such as about 0.18 micron and under, e.g., about 0.15 micron and under. The present invention advantageously enables manufacturing semiconductor devices having accurately dimensioned conductive features e.g., polycrystalline silicon gate electrodes, with high integrity employing deep UV photoresist technology. The methodology of the present invention advantageously eliminates pitting of the gate electrode surface during ARC removal.

Only the preferred embodiment of the present invention and an example of its versatility is shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductive device, the method comprising:

forming a silicon layer;

forming a protective silicon oxide layer on the silicon layer by low pressure chemical vapor deposition at a thickness of about 50 to 100 Angstroms employing TEOS and $N_2O$ at a temperature of about 700 to 800° Celsius;

forming an anti-reflective coating (ARC) on the protective oxide layer;

forming a photoresist mask on the ARC;

etching, using the photoresist mask, to pattern the silicon layer to form a conductive feature; and removing the ARC.

2. The method according to claim 1, comprising depositing the silicon oxide layer at a pressure of about 0.5 to 5 Torr.

3. The method according to claim 1, where the silicon layer comprises amorphous silicon or polycrystalline silicon.

4. The method according to claim 1, comprising stripping the photoresist mask.

5. The method according to claim 4, wherein the conductive feature is a gate electrode.

6. The method according to claim 1, wherein the ARC comprises a silicon oxynitride or a silicon-rich silicon nitride.

7. The method according to claim 6, comprising forming the ARC at a thickness of about 2 Å to about 300 Å.

8. The method according to claim 6, comprising stripping the ARC with hot phosphoric acid or by dry etching.

* * * * *